US011962120B2

(12) United States Patent
Ishige et al.

(10) Patent No.: US 11,962,120 B2
(45) Date of Patent: Apr. 16, 2024

(54) SEMICONDUCTOR LASER MODULE

(71) Applicant: FURUKAWA ELECTRIC CO., LTD., Tokyo (JP)

(72) Inventors: Yuta Ishige, Tokyo (JP); Etsuji Katayama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 801 days.

(21) Appl. No.: 16/988,875

(22) Filed: Aug. 10, 2020

(65) Prior Publication Data

US 2020/0373733 A1 Nov. 26, 2020

Related U.S. Application Data

(63) Continuation of application No. PCT/JP2019/005349, filed on Feb. 14, 2019.

(30) Foreign Application Priority Data

Feb. 14, 2018 (JP) .................................. 2018-024415

(51) Int. Cl.
*H01S 5/02253* (2021.01)
*G02B 6/42* (2006.01)
(Continued)

(52) U.S. Cl.
CPC ........ *H01S 5/02253* (2021.01); *H01S 3/0675* (2013.01); *H01S 3/06754* (2013.01);
(Continued)

(58) Field of Classification Search
None
See application file for complete search history.

(56) References Cited

U.S. PATENT DOCUMENTS 9,246,301 B1 1/2016 Hua
9,373,932 B2 6/2016 Hayamizu et al.
(Continued)

FOREIGN PATENT DOCUMENTS

CN 201203679 Y 3/2009
CN 103293679 A 9/2013
(Continued)

OTHER PUBLICATIONS

International Search Report dated May 14, 2019 in PCT/JP2019/005349 filed on Feb. 14, 2019, citing documents AA-AG & AO-AR therein, 2 pages.
(Continued)

*Primary Examiner* — Eric L Bolda
(74) *Attorney, Agent, or Firm* — Oblon, McClelland, Maier & Neustadt, L.L.P.

(57) ABSTRACT

A semiconductor laser module that can increase output of an optical fiber laser is provided. The semiconductor laser module includes: a mounted-base member having a mounted-base face; a plurality of semiconductor laser elements installed on the mounted-base face of the mounted-base member; a lens that collimates laser light emitted from the semiconductor laser element; a condensing lens that condenses the laser light; and an optical fiber to which the condensed laser light is optically coupled, and further includes: between the condensing lens that condenses the laser light and the lens that collimates laser light emitted from the semiconductor laser element, an aperture that restricts light in a slow axis direction of the laser light.

12 Claims, 7 Drawing Sheets

(51) Int. Cl.
*H01S 3/067* (2006.01)
*H01S 3/094* (2006.01)
*H01S 3/0941* (2006.01)
*H01S 5/00* (2006.01)
*H01S 5/02255* (2021.01)
*H01S 5/0239* (2021.01)
*H01S 5/40* (2006.01)

(52) U.S. Cl.
CPC .. *H01S 3/094003* (2013.01); *H01S 3/094053* (2013.01); *H01S 3/0941* (2013.01); *H01S 5/0078* (2013.01); *H01S 5/02255* (2021.01); *H01S 5/0239* (2021.01); *H01S 5/4012* (2013.01); *H01S 5/4031* (2013.01); *G02B 6/42* (2013.01)

(56) References Cited

U.S. PATENT DOCUMENTS

| | | | |
|---|---|---|---|
| 2002/0025096 A1* | 2/2002 | Wang | G02B 19/0028 385/8 |
| 2005/0063436 A1* | 3/2005 | Nishimura | H04N 9/3129 348/E9.026 |
| 2005/0175285 A1* | 8/2005 | Reynolds | G02B 19/0057 385/39 |
| 2007/0291373 A1 | 12/2007 | Hu et al. | |
| 2007/0291803 A1 | 12/2007 | Crum | |
| 2007/0291813 A1 | 12/2007 | Hu et al. | |
| 2008/0203838 A1 | 8/2008 | Komori et al. | |
| 2009/0251697 A1* | 10/2009 | Cutillas | H01S 5/024 385/94 |
| 2016/0246022 A1 | 8/2016 | Ishige et al. | |
| 2018/0175590 A1 | 6/2018 | Yamamoto et al. | |

FOREIGN PATENT DOCUMENTS

| | | |
|---|---|---|
| CN | 103487887 A | 1/2014 |
| CN | 204479809 U | 7/2015 |
| CN | 105652452 A | 6/2016 |
| JP | 10-325933 A | 12/1998 |
| JP | 2005-150451 A | 6/2005 |
| JP | 2006-301195 A | 11/2006 |
| JP | 5730814 B2 | 6/2015 |
| JP | 2015-126036 A | 7/2015 |
| WO | WO 2015/037725 A1 | 3/2015 |
| WO | WO 2017/0221 42 A1 | 2/2017 |

OTHER PUBLICATIONS

Combined Chinese Office Action and Search Report dated Oct. 17, 2022 in Chinese Patent Application No. 201980012972.3 (with English Translation of Office Action only), citing references 15-19 therein, 17 pages.

Japanese Office Action dated Oct. 17, 2023 in Japanese Application 2020-500555, (with unedited computer-generated English translation), citing documents 15-16 therein, 7 pages.

* cited by examiner

SEMICONDUCTOR LASER MODULE

CROSS-REFERENCE TO RELATED APPLICATIONS

This application is a Continuation of International Patent Application No. PCT/JP2019/005349, filed Feb. 14, 2019, which claims the benefit of Japanese Patent Application No. 2018-024415, filed Feb. 14, 2018, both of which are hereby incorporated by reference herein in their entirety.

BACKGROUND OF THE INVENTION

Field of the Invention

The present invention relates to a semiconductor laser module.

Description of the Related Art

Semiconductor lasers are featured in small power consumption, compactness, or the like and have been widely used in various fields such as optical communication, optical storage, processing of a material, or the like. As a semiconductor laser module on which a semiconductor laser is mounted, a module in which a plurality of semiconductor laser elements (hereafter, also referred to as a semiconductor laser) are provided in a package is known (Japanese Patent No. 5730814).

SUMMARY OF THE INVENTION

In a semiconductor laser module in which a plurality of semiconductor lasers are provided, laser light exiting from the plurality of semiconductor lasers is collimated through a lens, then collected through a condensing lens, and coupled to an optical fiber. The number of apertures of laser light entering an optical fiber will now be described with reference to FIG. 13 and FIG. 14.

Figure 13:
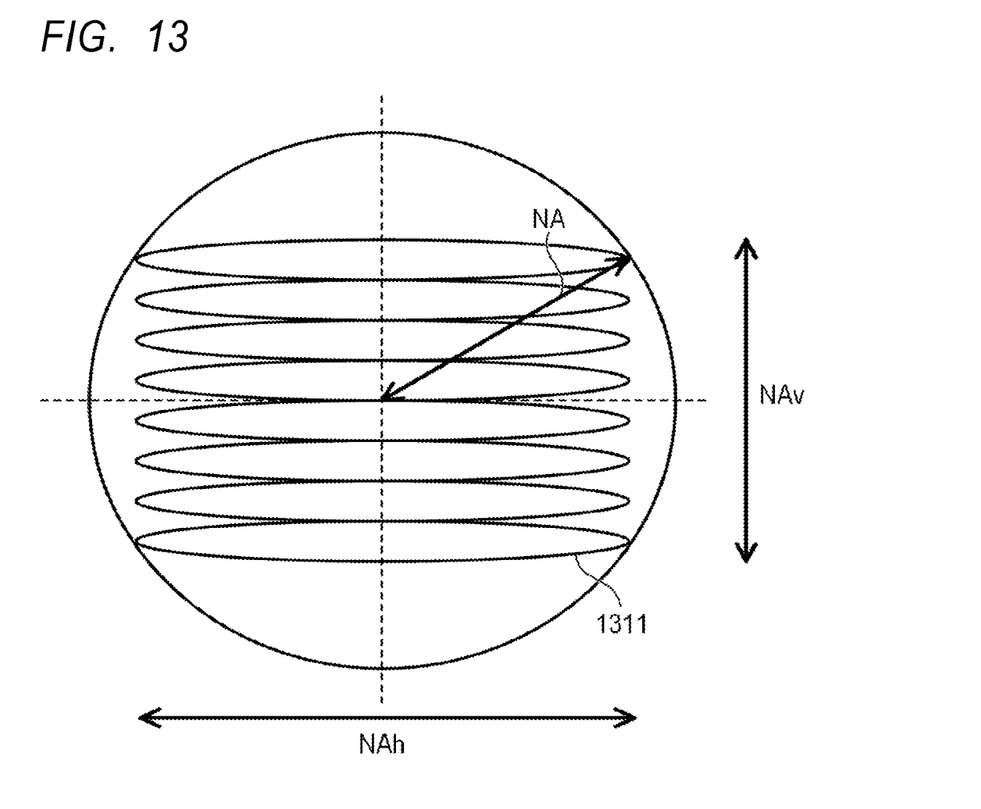
FIG. 13 is a schematic diagram illustrating a far-field pattern of laser light entering an optical fiber from a semiconductor laser.
Figure 14:
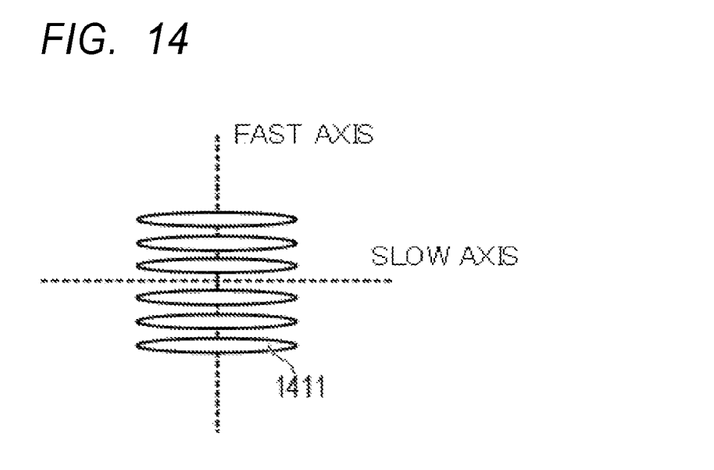
FIG. 14 is a schematic diagram illustrating an image of laser light entering a condensing lens from a semiconductor laser.

FIG. 13 is a schematic diagram illustrating a far-field image of laser light from a semiconductor laser entering an optical fiber. FIG. 14 is a schematic diagram illustrating an image of laser light from a semiconductor laser entering a condensing lens. A semiconductor laser is featured in that the far-field image has an elliptical shape due to influence of diffraction at an exit aperture for laser light. Thus, in the semiconductor laser module, the laser light originating from each semiconductor laser forms an elliptical far-field image 1311 at the time of entering the fiber, as illustrated in FIG. 13. Herein, the shorter axis of the elliptical far-field image 1311 is the fast axis of the laser light, and the longer axis is the slow axis. In the semiconductor laser module in which a plurality of semiconductor lasers are provided, laser light entering a condensing lens is formed as an image in which elliptical images 1411 originating from respective semiconductor lasers are overlapped in the fast axis direction, as illustrated in FIG. 14. Herein, the number of apertures $NA_{Fiberout}$ of the laser light entering the condensing lens is expressed by Equation 1, where the number of apertures of the laser light entering the optical fiber which are arranged in the slow axis direction is denoted as NAv, and the number of apertures which are arranged in the fast axis direction is denoted NAh.

$$NA_{Fiberout} = \sqrt{(NAh)^2 + (NAv)^2} \quad (1)$$

Herein, NAv changes in accordance with the beam spread angle in the fast axis direction of the semiconductor laser and the number of mounted semiconductor lasers, and NAh changes in accordance with the beam spread angle in the slow axis direction of the semiconductor laser. As the drive power of the semiconductor laser increases, the size of the elliptical image 1411 of the laser light entering the condensing lens increases, and in particular, the increase in the slow axis direction becomes notable. That is, an increase in the drive power of the semiconductor laser results in a significant increase in NAh. Thus, to control $NA_{Fiberout}$ so as not to exceed a certain value, the drive power of the semiconductor laser is limited to a certain level, and moreover, the number of semiconductor lasers that can be mounted is also restricted. For the reasons described above, there is a limitation in the increase in the output of an optical fiber laser in the conventional semiconductor laser module.

The present invention has been made in view of the above and intends to provide a semiconductor laser module that can increase the output of an optical fiber laser.

Solution to Problem

According to one aspect of the present invention, provided is a semiconductor laser module including: a mounted-base member having a mounted-base face; a plurality of semiconductor laser elements installed on the mounted-base face of the mounted-base member; a lens that collimates laser light emitted from the semiconductor laser element; a condensing lens that condenses the laser light; and an optical fiber to which the condensed laser light is optically coupled, and further includes: between the condensing lens that condenses the laser light and the lens that collimates laser light emitted from the semiconductor laser element, an aperture that restricts light in a slow axis direction of the laser light.

Advantageous Effects of Invention

According to the present invention, a semiconductor laser module that can increase the output of an optical fiber laser can be provided.

DESCRIPTION OF THE EMBODIMENTS

First Embodiment

Figure 1:
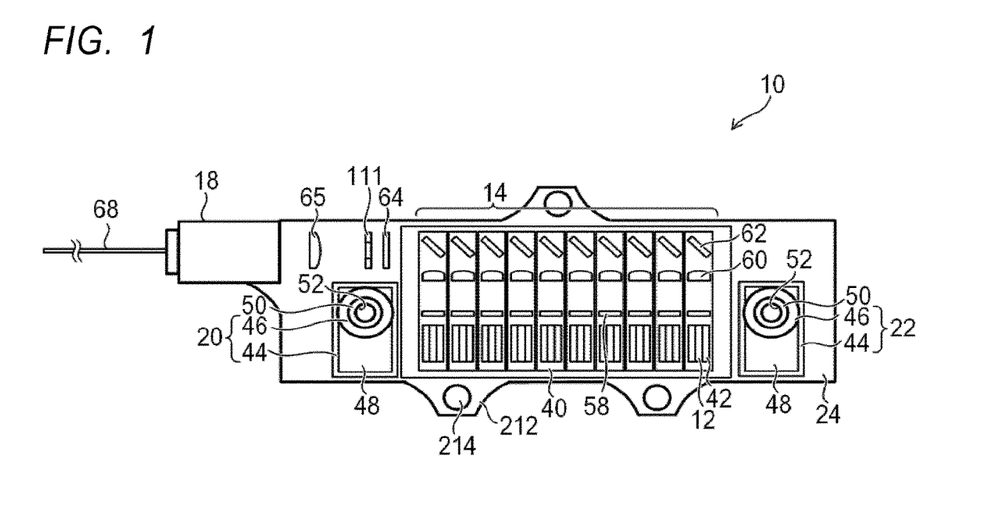
FIG. 1 is a top view illustrating a semiconductor laser module according to a first embodiment of the present invention.
Figure 2:
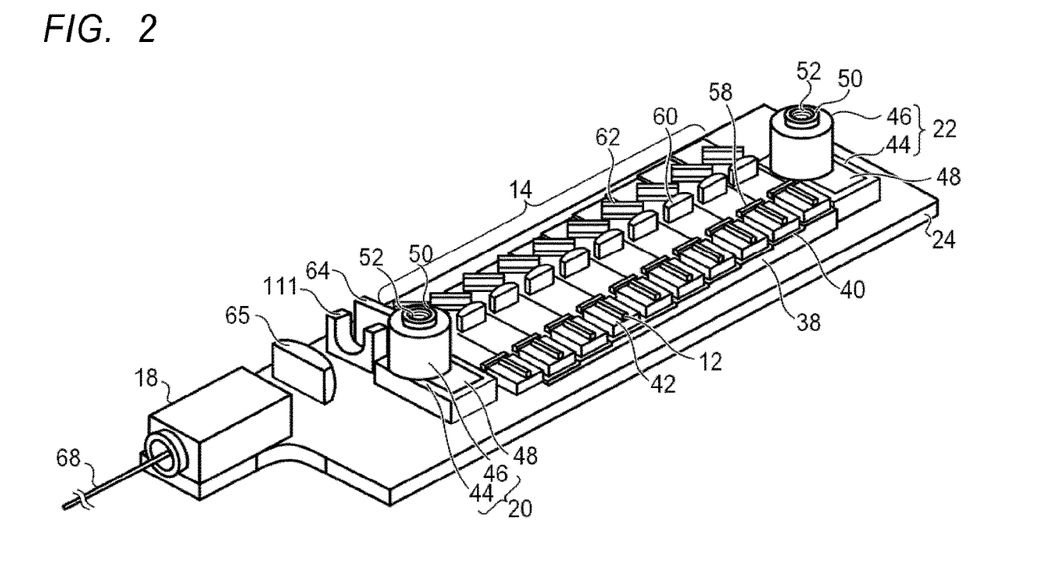
FIG. 2 is a perspective view illustrating the semiconductor laser module according to the first embodiment of the present invention.
Figure 3:
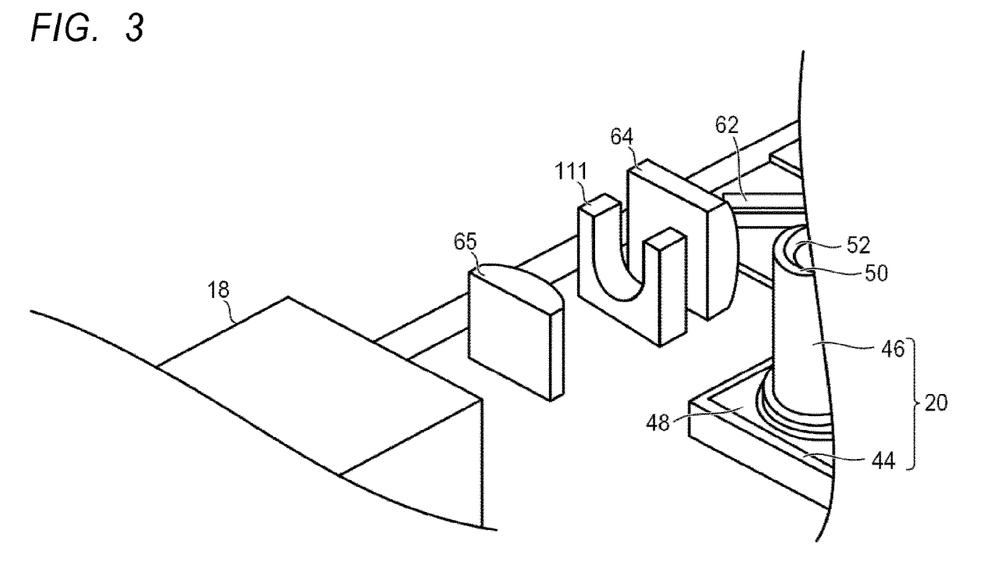
FIG. 3 is an enlarged partial perspective view illustrating an arrangement of an aperture in the semiconductor laser module according to the first embodiment of the present invention.

A semiconductor laser module according to a first embodiment of the present invention will be described with reference to FIG. 1 to FIG. 3.

First, the configuration of the semiconductor laser module according to the present embodiment will be described with reference to FIG. 1 to FIG. 3. FIG. 1 is a top view illustrating the semiconductor laser module according to the present embodiment. FIG. 2 is a perspective view illustrating the semiconductor laser module according to the present embodiment. Further, FIG. 3 is an enlarged partial perspective view illustrating the arrangement of an aperture in the semiconductor laser module according to the present embodiment.

The semiconductor laser module according to the present embodiment has a plurality of semiconductor laser elements as laser elements. As illustrated in FIG. 1 and FIG. 2, a semiconductor laser module 10 according to the present embodiment has a plurality of semiconductor laser elements 12 and an optical system 14 provided in association with the plurality of semiconductor laser elements 12. The semiconductor laser module 10 according to the present embodiment further has a bottom plate portion 24 that is a mounted-base member on which the plurality of semiconductor laser elements 12, the optical system 14, and the like are provided. The semiconductor laser module 10 according to the present embodiment further has an output unit 18 from which laser light is output and terminal portions 20 and 22 that can be externally electrically connected, respectively.

For example, the bottom plate portion 24 is a plate-like member having a plane shape, for example, a substantially rectangular shape that is a long shape in one direction and has an upper face and a lower face opposed to the upper face. The bottom plate portion 24 forms a mounted-base member together with a step portion 38 described later. In the bottom plate portion 24, one end portion and the other end portion opposed to each other in the longitudinal direction correspond to a front area end portion and a rear area end portion, respectively. Note that the plane shape of the bottom plate portion 24 is not particularly limited, and various shapes can be employed.

The mounted-base member formed of the bottom plate portion 24 and the step portion 38 has a plurality of mounted-base faces on which the semiconductor laser element 12, the optical system 14, the terminal portions 20 and 22, and the like are mounted. Specifically, the upper face of the bottom plate portion 24 and upper faces of a plurality of steps 40 in the step portion 38 form a mounted-base face. The respective upper faces of the plurality of steps 40 are mounted-base faces parallel to the upper face of the bottom plate portion 24, and the height from the upper face of the bottom plate portion 24 is different from each other.

Note that the mounted-base member on which the semiconductor laser element 12, an optical element forming the optical system 14, and the like are mounted is not limited to a member formed of a plate-like member such as the bottom plate portion 24 and the step portion 38 provided thereon. The mounted-base member may be any member having one or multiple mounted-base faces on which the semiconductor laser element 12, an optical element, or the like may be mounted. Further, while the mounted-base face may be not only a plane face but also a curved face or a concave-convex face, a plane face is preferable.

On the upper face of the bottom plate portion 24, the plurality of semiconductor laser elements 12, the optical system 14, condensing lenses 64 and 65 described later, and an aperture 111 described later are provided. Further, on the upper face of the bottom plate portion 24, the terminal portions 20 and 22 are provided as described later.

As described later, when the semiconductor laser module 10 is installed on a substrate, the bottom plate portion 24 is installed such that a lower face of the bottom plate portion 24 is in contact with an installation face of the substrate. On the upper face of the bottom plate portion 24, the step portion 38 is provided. The step portion 38 is formed in a stepped shape, and when the side where the semiconductor laser module 10 outputs laser light is defined as the front area, the step portion 38 has a plurality of steps 40 provided to be aligned along the front-back direction of the bottom plate portion 24. The height of the plurality of steps 40 of the step portion 38 increases stepwise from the front area to the rear area. That is, the upper faces of the plurality of steps 40 that are mounted-base faces, respectively, have the height higher in the rear area than in the front area from the upper face of the bottom plate portion 24. The step portion 38 may be integrally formed with the bottom plate portion 24 or may be a separate component fixed to the bottom plate portion 24 by soldering or the like.

On the upper face of the bottom plate portion 24 and the upper faces of the plurality of steps 40 of the step portion 38, the plurality of semiconductor laser elements 12 are installed. The plurality of semiconductor laser elements 12 are of the same type of semiconductor laser element having the same laser properties such as an oscillation wavelength, the output, and others, for example. Note that the number of multiple semiconductor laser elements 12 is not particularly limited and can be appropriately set in accordance with laser output or the like required for the semiconductor laser module 10.

The plurality of semiconductor laser elements 12 are elements that are formed on separate chips and are independent of each other. Each semiconductor laser element 12 is installed on the upper face of the bottom plate portion 24 and on the plurality of steps 40 of the step portion 38 in a form of a chip on submount (COS) in which the semiconductor laser element 12 is fixed and mounted on a submount 42 by soldering or the like, for example.

The plurality of semiconductor laser elements 12 installed on the bottom plate portion 24 and on the plurality of steps 40 of the step portion 38 are aligned in a line along the longitudinal direction of the bottom plate portion 24. A height difference due to the step portion 38 is provided between the plurality of semiconductor laser elements 12 aligned in a line. The plurality of semiconductor laser elements 12 are arranged such that each output direction of laser light is the latitudinal direction of the bottom plate portion 24. The plurality of semiconductor laser elements 12 aligned in a line are arranged such that laser light is output to the same one side with respect to the alignment. Note that the alignment of the plurality of semiconductor laser elements 12 may be provided not only in a single line but also in multiple lines.

In the alignment of the plurality of semiconductor laser elements 12, electrodes of adjacent semiconductor laser elements 12 are electrically connected to each other by wire bonding or the like. In such a way, the plurality of semiconductor laser elements 12 are connected to each other in series. Note that, while a method for electrically connecting the semiconductor laser elements 12 to each other is not particularly limited and various methods can be used, a method by using wire bonding disclosed in Japanese Patent Application Publication No. 2015-185667 can be used, for example.

On the front area side of the alignment of the plurality of semiconductor laser elements 12, the terminal portion 20 is provided on the upper face of the bottom plate portion 24. Further, on the rear area side of the alignment of the plurality of semiconductor laser elements 12, the terminal portion 22 is provided on the upper face of the bottom plate portion 24. Each of the terminal portions 20 and 22 can be electrically connected to an external drive power source and are used for applying drive current to each of the plurality of semiconductor laser elements 12 from the drive power source. One of the terminal portions 20 and 22 is connected to the positive electrode terminal of the drive power source, and the other is connected to the negative electrode terminal of the drive power source.

Each of the terminal portions 20 and 22 has an element connection portion 44 and an external connection portion 46 electrically connected to the element connection portion 44. Each of the terminal portions 20 and 22 is of a connection form using a screw in external electrical connection.

The element connection portion 44 of each of the terminal portions 20 and 22 is provided on the upper face of the bottom plate portion 24. As described above, the element connection portion 44 that is one part of each of the terminal portions 20 and 22 is provided on the bottom plate portion 24. Each element connection portion 44 of each of the terminal portions 20 and 22 has a sheet-like conductor 48. The sheet-like conductor 48 is provided parallel to the bottom plate portion 24. The sheet-like conductor 48 is electrically connected, via a wire by wire bonding, to an electrode of the semiconductor laser element 12 that is the end portion in the alignment of the plurality of semiconductor laser elements 12 connected to each other in series, for example.

More specifically, the sheet-like conductor 48 of the element connection portion 44 in the terminal portion 20 is electrically connected, via a wire by wire bonding, to an electrode of the semiconductor laser element 12 that is the end portion on the front side in the alignment of the plurality of semiconductor laser elements 12 connected to each other in series. The sheet-like conductor 48 of the element connection portion 44 in the terminal portion 22 is further electrically connected, via a wire by wire bonding, to an electrode of the semiconductor laser element 12 that is the end portion on the rear side in the alignment of the plurality of semiconductor laser elements 12 connected to each other in series. Note that a method for electrically connecting the sheet-like conductor 48 of the element connection portion 44 and an electrode of the semiconductor laser element 12 to each other is not limited to a method by using wire bonding, and various methods may be used.

The external connection portion 46 of each of the terminal portions 20 and 22 is provided on the element connection portion 44. The external connection portion 46 of each of the terminal portions 20 and 22 has a columnar conductor 50 formed in a columnar shape perpendicular to the bottom plate portion 24, for example. In each of the terminal portions 20 and 22, the columnar conductor 50 is electrically connected to the sheet-like conductor 48. Each columnar conductor 50 has an internal thread hole 52 opening upward at the upper end. As described later, each internal thread hole 52 is used for external electrical connection. In such a way, the external connection portion 46 of each of the terminal portions 20 and 22 is provided upward with respect to the bottom plate portion 24. That is, the external connection portion 46 that is one part of each of the terminal portions 20 and 22 is provided opposite to the installation face where the bottom plate portion 24 is installed and fixed so as to extend in the direction opposite to the installation face. Note that being upward with respect to the bottom plate portion 24 may include a case of being upward with respect to the bottom plate portion 24 in the direction inclined at a predetermined inclination angle with respect to the direction orthogonal to the bottom plate portion 24 other than a case of being upward with respect to the bottom plate portion 24 in the direction orthogonal to the bottom plate portion 24. That is, the upward direction relative to the bottom plate portion 24 is not only the direction orthogonal to the bottom plate portion 24 and may be the direction inclined at a predetermined inclination angle with respect to the direction orthogonal to the bottom plate portion 24.

The external connection portion 46 of each of the terminal portions 20 and 22 can be externally electrically connected by using a screw or a thread portion that are screwed to the internal thread hole 52. For example, a bus bar that is a conductor bar is in contact with the columnar conductor 50 and is fixed to the external connection portion 46 by a screw screwed to the internal thread hole 52, and the external connection portion 46 can be externally electrically connected via the fixed bus bar. Further, by using an external terminal having an external thread portion screwed to the internal thread hole 52, the external thread portion of the external terminal is screwed and fixed to the internal thread hole 52, and the external connection portion 46 can be externally electrically connected via the fixed external terminal. Further, for example, an external terminal that is a crimp-style terminal having a round shape or a tip-opened shape is fixed to the external connection portion 46 while being in contact with the columnar conductor 50 by using an external thread screwed to the internal thread hole 52, and the external connection portion 46 can be externally electrically connected via the fixed external terminal.

The optical system 14 is provided on one side of the alignment of the plurality of semiconductor laser elements 12. The optical system 14 has a plurality of sets of collimator lenses 58 and 60 and a reflection mirror 62 as optical elements forming the optical system 14. The plurality of sets of collimator lenses 58 and 60 and the reflection mirror 62 are installed on the upper face of the bottom plate portion 24 and on the upper faces of the plurality of steps 40 of the step portion 38 in association with the plurality of semiconductor laser elements 12. The plurality of collimator lenses 58 are of the same type having the same optical properties. The plurality of collimator lenses 60 are of the same type having the same optical properties. The plurality of reflection mirrors 62 are of the same type having the same optical properties. The optical element forming the optical system 14 is not limited to the collimator lenses 58 and 60 and the reflection mirror 62 and can be formed of other optical elements.

In each set of the collimator lenses 58 and 60 and the reflection mirror 62, the collimator lenses 58 and 60 are arranged in series on the laser light output side of the corresponding semiconductor laser element 12. The reflection mirror 62 is further arranged in the post-stage of the collimator lens 60. The collimator lenses 58 and 60 collimate laser light output from the corresponding semiconductor laser element 12 in the vertical direction and in the horizontal direction, respectively, and convert the laser light into parallel light. The reflection mirror 62 reflects the laser light collimated by the corresponding collimator lenses 58 and 60 to the front area side by 90 degrees and guides the laser light to the front area side of the bottom plate portion 24 on which the output unit 18 is provided.

The output unit 18 is provided on the upper face of the front area end portion of the bottom plate portion 24. The condensing lenses 64 and 65 and the aperture 111 are provided between the output unit 18 and the optical system 14. The output unit 18 has an optical fiber 68 used for outputting laser light and outputs laser light through the optical fiber 68. Note that the length of the optical fiber 68 can be appropriately changed in accordance with design.

The optical fiber 68 of the output unit 18 has a fixed end that is an end fixed on the upper face of the bottom plate portion 24 and an output end that is an end drawn to the outside of the bottom plate portion 24. The condensing lenses 64 and 65 form, together with the optical system 14, an optical system for causing laser light output from the plurality of semiconductor laser elements 12 to enter the fixed end of the optical fiber 68. The condensing lenses 64 and 65 cause laser light reflected from each of the plurality of reflection mirrors 62 to be condensed at and to enter the fixed end of the optical fiber 68. The laser light entering the fixed end of the optical fiber 68 propagates through the optical fiber 68 and is output from the output end of the optical fiber 68 as the output of the semiconductor laser module 10. In the present embodiment, while the example formed of two condensing lenses is illustrated, the condensing lens may be formed of a single lens or a plurality of lenses that are more than two lenses. When the condensing lens is formed of a single lens, the condensing lens is a condensing lens that condenses the light in both directions of the fast axis direction and the slow axis direction of laser light. In the present invention, when the condensing lens is formed of a single lens, the condensing lens 65 that condenses the laser light in the slow axis direction in the description of the specification can be used as a condensing lens that condenses the light in both directions of the fast axis direction and the slow axis direction. Note that the configuration of an optical system for causing the laser light to enter the fixed end of the optical fiber 68 may have various filters.

The aperture 111 restricts the slow axis direction of the laser light output from the semiconductor laser element 12. As illustrated in FIG. 2, the aperture 111 according to the present embodiment is a member having a U-shape space through which the laser light passes. The aperture 111 is not limited to a U-shape illustrated in the present embodiment as long as the aperture is configured to have a space in the central part of the slow axis direction through which the laser light passes and, at the slow axis end part, a member that interposes the space and prevents passage of the laser light. As the material of a member forming the aperture 111, any material that is usually used as a material of an aperture generally embedded into a laser module can be used, for example, copper, iron, aluminum, copper tungsten, SUS, Kovar, or the like are used. Specifically, in terms of heat dissipation, copper is preferable. It is preferable that surface treatment to reflect or absorb laser light be applied to the surface of the aperture 111. The surface treatment may be, for example, gold plating, nickel plating, alumite treatment, blackening treatment, RAYDENT treatment, or the like. Specifically, in terms of reflection, gold plating is preferable. In the aperture 111, taper cut may be applied between a face perpendicular to the optical axis of the laser light and a face that is parallel to the optical axis of the laser light and in contact with a space through which the laser light passes. In particular, when surface treatment causing reflection of laser light has been applied to the surface of the aperture 111, it is possible to prevent the reflected light from returning to the laser light emission side by providing a taper in a range irradiated with the slow axis end part of the laser light.

The aperture 111 in the present embodiment is provided between the condensing lens 64 and the condensing lens 65. Here, the condensing lens 64 is a lens that condenses the laser light in the fast axis direction, and the condensing lens 65 is a lens that condenses the laser light in the slow axis direction. The aperture 111 can be provided on an optical path between the condensing lens 65 that condenses the laser light in the slow axis direction and the collimator lens 60 that collimates the laser light, and the position thereof is not limited to the position illustrated in the present embodiment. Further, the aperture 111 may be configured integrally with or independently of the condensing lens 64 or the condensing lens 65. Further, when the condensing lenses are formed of multiple lenses, the aperture 111 can be provided on an optical path between at least one condensing lens which condenses the laser light in the slow axis direction and causes the laser light to enter the fixed end of the optical fiber 68 in the output unit 18 and the collimator lens 60 that collimates the laser light. The aperture 111 can be fixed on the upper face of the bottom plate portion 24 by using an adhesive agent, screwing, soldering, or the like, for example. The aperture 111 can also be installed later on the semiconductor laser module having no aperture. Further, as illustrated in another embodiment described later, the aperture 111 may be provided so that the direction with respect to the optical axis of the above laser light can be changed by an adjustable mechanism after assembly of the semiconductor laser module.

The semiconductor laser module 10 according to the present embodiment has a plurality of fixed portions 212 provided on the bottom plate portion 24. Each fixed portion 212 is provided on the bottom plate portion 24 so as to protrude outward from the bottom plate portion 24. For example, two fixed portions 212 are provided on one edge portion out of two edge end portions along the longitudinal direction of the bottom plate portion 24, and one fixed portion 212 is provided on the other edge portion. Note that the number and the positions of fixed portions 212 are not particularly limited and can be appropriately changed.

In each fixed portion 212, a through-hole 214 through which a fixing screw penetrates is provided. For example, the plurality of semiconductor laser modules 10 are aligned on an installation face of a substrate and used as a light source device. When an internal thread hole is provided in the installation face of the substrate, it is possible to attach and fix the semiconductor laser module 10 to the installation face of the substrate by using a fixing screw that penetrates through the through-hole 214 of each fixed portion 212 and is screwed to an internal thread hole provided in the installation face of the substrate. Note that a method for fixing the semiconductor laser module 10 on the installation face of the substrate is not particularly limited, and in addition to a method using a fixing screw, various methods such as a method using a bolt and a nut can be used. Further, instead of the bottom plate portion 24 having the plurality of fixed portions 212, a through-hole through which a fixing screw penetrates may be provided at a front end portion and a rear end portion of the bottom plate portion 24.

In such a way, the semiconductor laser module 10 according to the present embodiment is configured.

In the present embodiment, while the case where the terminal portions 20 and 22 have the internal thread hole 52 has been described as an example, the embodiment is not limited thereto. Instead of the internal thread hole 52, the terminal portions 20 and 22 may have an external thread portion for external electrical connection. In such a case, for example, an external terminal that is in contact with an external thread portion via an annular portion or the like inserted to the external thread portion by using a nut or the like screwed to the external thread portion can be fixed to the terminal portions 20 and 22.

Further, in the present embodiment, while those of a connection form using a screw or an opening portion as the terminal portions 20 and 22 have been described as an example, the embodiment is not limited thereto, and another connection form can be used. For example, those of a connection form using a jack into which a plug such as a banana plug can be inserted can be used as the terminal portion 20 and 22.

When the semiconductor laser module 10 according to the present embodiment operates, drive current is applied to the plurality of semiconductor laser elements 12 connected in series to each other, respectively, by the external drive power source electrically connected to the terminal portions 20 and 22. When the drive current is applied, each semiconductor laser element 12 causes laser oscillation and outputs laser light. The laser light output from each semiconductor laser element 12 is collimated by the corresponding collimator lenses 58 and 60, then reflected by the corresponding reflection mirror 62, and guided to the condensing lens 64. The laser light condensed in the fast axis direction by the condensing lens 64 is guided to the aperture 111. The laser light restricted in the slow axis direction end portion at the aperture 111 is condensed in the slow axis direction by the condensing lens 64 and enters the fixed end of the optical fiber 68 of the output unit 18. The laser light entering the fixed end of the optical fiber 68 is output from the output end of the optical fiber 68 as the output of the semiconductor laser module 10.

As described above, in the semiconductor laser module 10 according to the present embodiment, the aperture 111 is provided on the optical path between the condensing lens 65 that condenses laser light in the slow axis direction on the upper face of the bottom plate portion 24 and the collimator lens 60 that collimates laser light. Thus, the slow axis direction end portion of the laser light collimated by the collimator lenses 58 and 60 is restricted by the aperture 111 before being guided to the condensing lens 65 that condenses the laser light in the slow axis direction. At this time, the laser light that passes through the space in the aperture 111 enters the condensing lens 65 that condenses the laser light in the slow axis direction. That is, NAh of the laser light entering the condensing lens 65 that condenses the laser light in the slow axis direction is less than or equal to a value restricted due to the width of the space in the aperture 111. That is, the NAh of the laser light entering the condensing lens 65 that condenses the laser light in the slow axis direction can be controlled to be less than or equal to the certain value by providing the aperture 111. The upper limit of NAh can be arbitrarily controlled by changing the width of the space in the aperture.

Although NAh of the laser light emitted from the semiconductor laser element 12 significantly increases as the drive power of the semiconductor laser increases, NAh can be controlled to be less than or equal to a certain value by providing the aperture 111. Thus, it is possible to suppress a significant increase in NAh due to an increase of the drive power of the semiconductor laser element 12. Furthermore, since the NAh is restricted to be less than or equal to the certain value due to the aperture 111, there is room to increase NAv within a range of a certain $NA_{Fiberout}$. That is, it is also possible to increase the number of semiconductor laser elements 12 that can be mounted. As described above, in the semiconductor laser module according to the embodiment of the present invention, it is possible to increase the output of the optical fiber laser.

Figure 4:
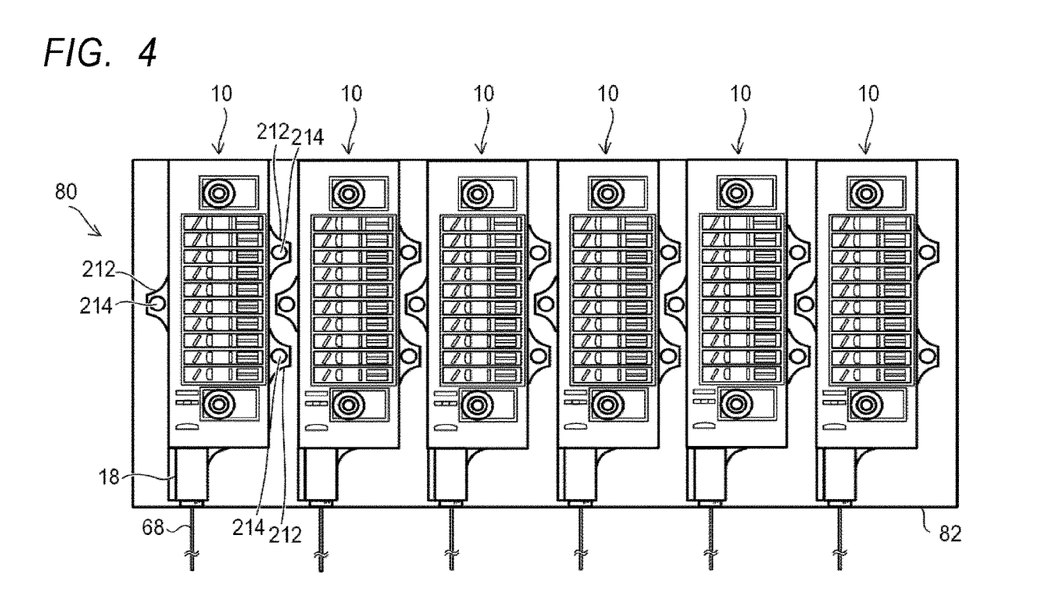
FIG. 4 is a schematic diagram illustrating a light source device according to the first embodiment of the present invention.

The semiconductor laser module 10 according to the present embodiment can form a light source device when aligned in multiple lines. By using the plurality of semiconductor laser modules 10, it is possible to increase the output of the light source device. The light source device according to the present embodiment in which the plurality of semiconductor laser modules 10 are aligned will be described below with reference to FIG. 4. FIG. 4 is a schematic diagram illustrating the light source device according to the present embodiment.

As illustrated in FIG. 4, a light source device 80 according to the present embodiment has a substrate 82 and the plurality of semiconductor laser modules 10 aligned and installed on the substrate 82. Note that the number of multiple semiconductor laser modules 10 is not particularly limited and can be appropriately set in accordance with laser output or the like required for the light source device 80.

The substrate 82 has an installation face on which the plurality of aligned semiconductor laser modules 10 are installed and is a base member that supports the plurality of semiconductor laser modules 10 installed on the installation face. Each of the plurality of semiconductor laser modules 10 is attached and fixed on the installation face of the substrate 82 such that the bottom plate portion 24 side faces the substrate 82 side. On the installation face of the substrate 82 on which the semiconductor laser modules 10 are aligned, an internal thread hole to which a fixing screw that is an external thread is screwed is provided. The semiconductor laser module 10 is attached and fixed on the installation face of the substrate 82 by using a fixing screw that penetrates through the through-hole 214 of each fixed portion 212 and is screwed to an internal thread hole provided in the installation face of the substrate 82. Note that a method for fixing the semiconductor laser module 10 on the installation face of the substrate 82 is not particularly limited, and in addition to the method using a fixing screw, various methods such as a method using a bolt and a nut can be used. Note that a base member on which the plurality of semiconductor laser modules 10 are installed is not limited to a plate-like member such as the substrate 82, and various shapes can be employed. For example, the base member on which the plurality of semiconductor laser modules 10 are installed may be a member that functions as a heat dissipation member such as a heatsink. In such a case, as the base member, a member having a plurality of fins for improving heat dissipation performance can be employed, for example.

The plurality of semiconductor laser modules 10 installed on the installation face of the substrate 82 are aligned in a line in the horizontal direction when the longitudinal direction of the substrate 82 is defined as the alignment direction, for example. In the plurality of semiconductor laser modules 10 aligned in a line, the output units 18 face the same side with respect to the alignment. Each of the plurality of semiconductor laser modules 10 is arranged such that the longitudinal direction of the bottom plate portion 24 is orthogonal to the alignment direction of the plurality of semiconductor laser modules 10. Note that the inclination angle of the semiconductor laser module 10 with respect to the alignment direction is not particularly limited and can be appropriately set. Further, two adjacent semiconductor laser modules 10 may be aligned such that the bottom plate portion 24 and the side end portion of a lid portion 26 are in close contact with each other or may be aligned at certain intervals.

The terminal portion 20 of one semiconductor laser module 10 and the terminal portion 22 of the other semiconductor laser module 10 of two adjacent semiconductor laser modules 10 may be electrically connected to each other by a bus bar that is a conductor bar. One end of the bus bar is fixed to the terminal portion 20 and can be electrically connected to the terminal portion 20 by a fixing screw screwed to the internal thread hole 52 of the terminal portion 20 of one semiconductor laser module 10. The other end of the bus bar is fixed to the terminal portion 22 and can be electrically connected to the terminal portion 22 by a fixing screw screwed to the internal thread hole 52 of the terminal portion 22 of the other semiconductor laser module 10. In such a way, the plurality of semiconductor laser modules 10 can be connected to each other in series. Note that a method for electrically connecting the plurality of semiconductor laser modules 10 to each other is not limited to the method using a bus bar, and various methods such as a method using a lead line can be used.

In such a way, the light source device 80 according to the present embodiment is configured.

While the case where the plurality of semiconductor laser modules 10 are installed on the substrate 82 has been described as an example in the present embodiment, the embodiment is not limited thereto. In addition to the substrate 82, the plurality of semiconductor laser modules 10 can be installed on an installation face of various base members such as an installation stage.

Further, as illustrated in FIG. 4, in the present embodiment, while the case where each output unit 18 in the plurality of semiconductor laser modules 10 aligned in a line faces the same side with respect to the alignment has been described as an example, the embodiment is not limited thereto. For example, the plurality of semiconductor laser modules 10 aligned in a line may have the output units 18 that alternately face one side and the other side with respect to the alignment. In such a case, since the terminal portions 20 and 22 to be connected by the bus bar in the two adjacent semiconductor laser modules 10 are located on the same side to each other, the length of the bus bar can be reduced, and accordingly, the electrical connection path can be shortened.

As described above, since it is possible to increase the output of the semiconductor laser module 10 according to the present embodiment, it is also possible to increase the output of the light source device 80 using the plurality of semiconductor laser modules 10.

Figure 5:
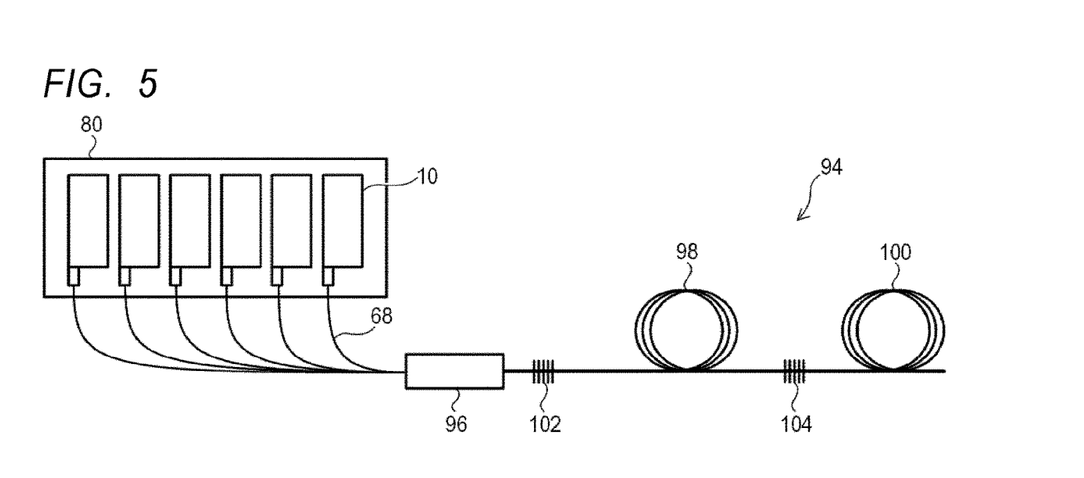
FIG. 5 is a schematic diagram illustrating an optical fiber laser using the light source device as an excitation light source according to the first embodiment of the present invention.

The light source device 80 according to the present embodiment can be used as an excitation light source of an optical fiber laser, for example. An optical fiber laser using the light source device 80 according to the present embodiment as an excitation light source will now be described with reference to FIG. 5. FIG. 5 is a schematic diagram illustrating the optical fiber laser using the light source device 80 according to the present embodiment as an excitation light source.

As illustrated in FIG. 5, an optical fiber laser 94 using the light source device 80 according to the present embodiment as an excitation light source has the light source device 80 as an excitation light source and a pump combiner 96 as an optical combiner portion. Further, the optical fiber laser 94 has a rare-earth-doped optical fiber 98 as an optical fiber for amplification and an output side optical fiber 100. A high-reflection fiber Bragg grating (FBG) 102 and a low-reflection FBG 104 are provided at an input end and an output end of the rare-earth-doped optical fiber 98, respectively.

Output ends of the optical fibers 68 of the output units 18 in the plurality of semiconductor laser modules 10 included in the light source device 80 are connected to a plurality of input ports of the multiple-input single-output pump combiner 96, respectively. An output port of the pump combiner 96 is connected to an input end of the rare-earth-doped optical fiber 98. An output end of the rare-earth-doped optical fiber 98 is connected to an input end of the output side optical fiber 100. Note that, instead of the pump combiner 96, another configuration can be used as an incident portion for causing the laser light output from the plurality of semiconductor laser modules 10 to enter the rare-earth-doped optical fiber 98. For example, the optical fibers 68 of the output units 18 in the plurality of semiconductor laser modules 10 may be arranged in alignment, and an incident portion such as an optical system including a lens may be used to cause the laser light output from the plurality of optical fibers 68 to enter the input end of the rare-earth-doped optical fiber 98.

In such a way, the optical fiber laser 94 using the light source device 80 according to the present embodiment as an excitation light source is configured.

In the optical fiber laser 94, the laser light output from the optical fibers 68 of the plurality of semiconductor laser modules 10 is coupled by the pump combiner 96 and output from the output port thereof. The pump combiner 96 as an incident portion causes the laser light as excitation light output from the output port thereof to enter the input end of the rare-earth-doped optical fiber 98. In the rare-earth-doped optical fiber 98, a resonator including the rare-earth-doped optical fiber 98 is formed of the high-reflection FBG 102 and the low-reflection FBG 104.

In the rare-earth-doped optical fiber 98 that is an optical fiber for amplification, the propagated excitation light is absorbed by a rare-earth element doped in a core, an inverted distribution between the ground level and a metastable level occurs, and light is emitted. The light emitted in such a way causes laser oscillation due to a light amplification effect of the rare-earth-doped optical fiber 98 and the effect of the laser resonator formed of the high-reflection FBG 102 and the low-reflection FBG 104. As described above, the laser light is generated by laser oscillation. The generated laser light is output from the output end of the output side optical fiber 100 connected to the output end of the rare-earth-doped optical fiber 98.

As illustrated in FIG. 5, in the present embodiment, while the case where the light source device 80 is used as an excitation light source of the optical fiber laser 94 has been described as an example, the embodiment is not limited thereto. The light source device 80 can be used as a light source of various devices such as a device that performs wavelength synthesis, a device that performs polarization synthesis or various systems. Further, the light source device 80 can be used as a direct diode laser. For example, the light source device 80 can be used together with an optical system that the laser light output from the plurality of semiconductor laser modules 10 thereof enters. In the optical system, a lens such as a condensing lens, a combiner, a mirror, or the like are included. More specifically, the laser light output from the plurality of semiconductor laser modules 10 in the light source device 80 can be condensed and output by the optical system including a lens. The laser light output from the plurality of semiconductor laser modules 10 in the light source device 80 can be further coupled and output by the combiner. Note that, in the plurality of semiconductor laser modules 10 in the light source device 80, the laser properties such as a wavelength of the laser light may be the same as or different from each other. The laser properties of the plurality of semiconductor laser modules 10 can be appropriately set in accordance with a use of the light source device 80.

Second to Fourth Embodiments

Figure 6:
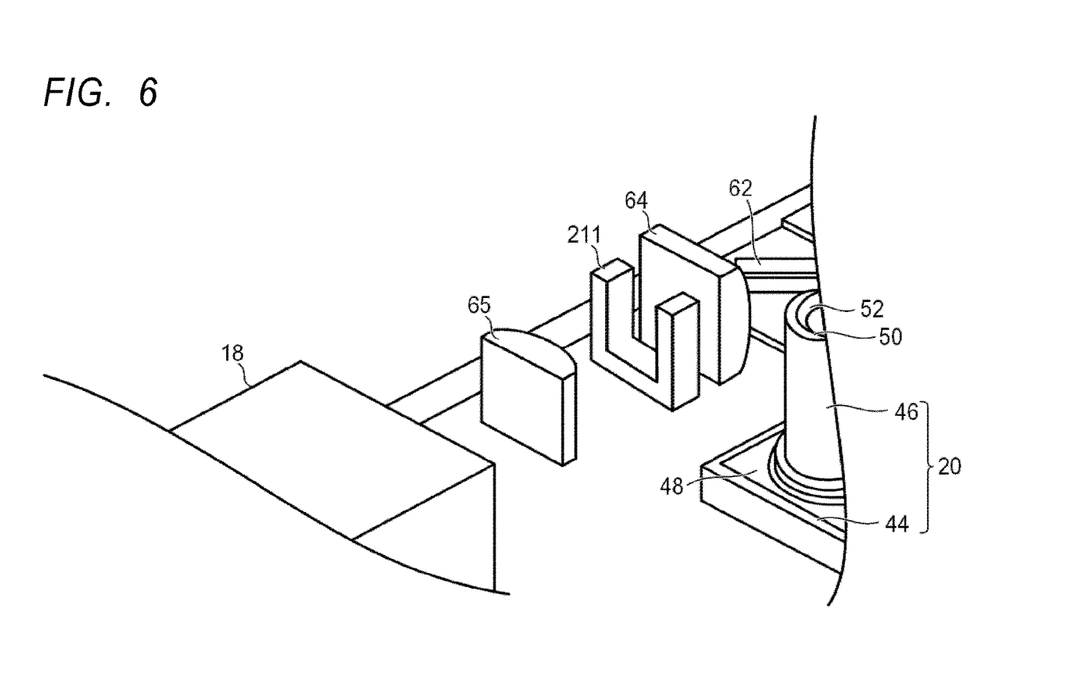
FIG. 6 is an enlarged partial perspective view illustrating the arrangement of an aperture in a semiconductor laser module according to a second embodiment of the present invention.

The semiconductor laser modules according to second to fourth embodiments of the present invention will be described with reference to FIG. 6 to FIG. 8. Note that the same components as those of the semiconductor laser module according to the above first embodiment are labeled with the same references, and the description thereof will be omitted or simplified.

The configurations of the semiconductor laser modules according to the second to fourth embodiments are the same as the semiconductor laser module 10 according to the first embodiment except that the aperture 111 is replaced with an aperture 211 in the second embodiment, replaced with an aperture 311 in the third embodiment, and replaced with an aperture 411 in the fourth embodiment, respectively.

In the semiconductor laser module according to the second embodiment, the space in the aperture 211 through which the laser light passes has a rectangular shape having an open shape at the top. As illustrated in FIG. 6, while the aperture 211 is provided between the condensing lens 64 and the condensing lens 65 in the present embodiment, for example, the aperture 211 can be provided in front of the part where the laser light enters the condensing lens 64. Although the laser light before entering the condensing lens 64 that condenses the laser light in the fast axis direction spreads in the fast axis direction, the space in the aperture 211 has a rectangular shape, and thereby, the laser light in the slow axis direction can be guided to the condensing lens 64 at the same width regardless of the position in the fast axis direction.

Figure 7:
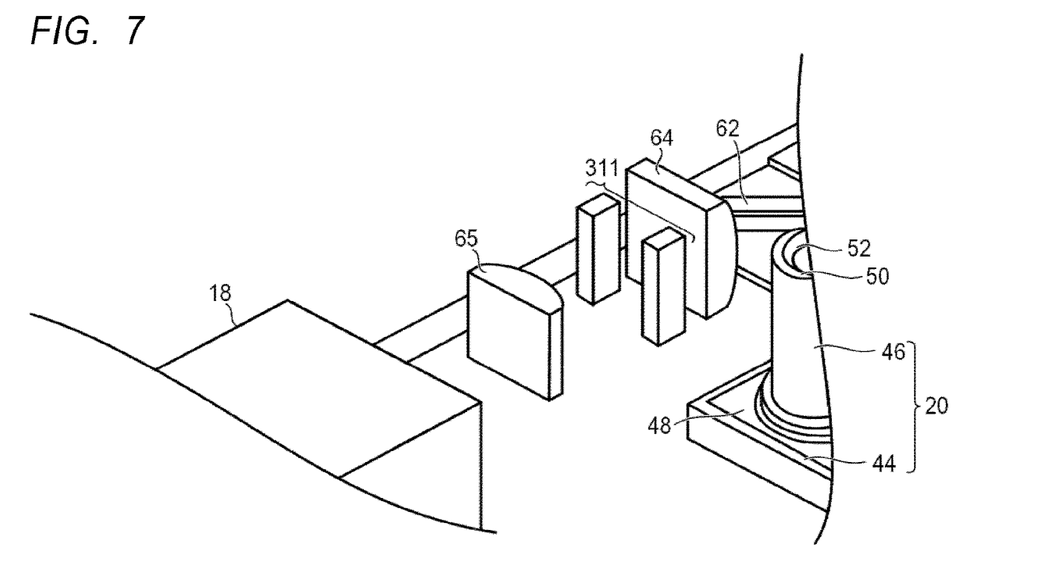
FIG. 7 is an enlarged partial perspective view illustrating the arrangement of an aperture in a semiconductor laser module according to a third embodiment of the present invention.

As illustrated in FIG. 7, in the semiconductor laser module according to the third embodiment, the aperture 311 is formed of two cuboid members. The feature that the shape of the space in the aperture 311 through which the laser light passes has a rectangular shape is the same as the aperture 211 used in the second embodiment. Further, for example, the feature that the laser light in the slow axis direction can be guided to the condensing lens 64 at the same width regardless of the position in the fast axis direction when the aperture 311 is provided in front of the part where the laser light enters the condensing lens 64 is also the same as the second embodiment. Since the aperture 311 is formed of two members that are independent of each other, the width of the space through which the laser light passes can be appropriately changed. Further, the shape of the member forming the aperture 311 is simple, which is advantageous for manufacturing.

Figure 8:
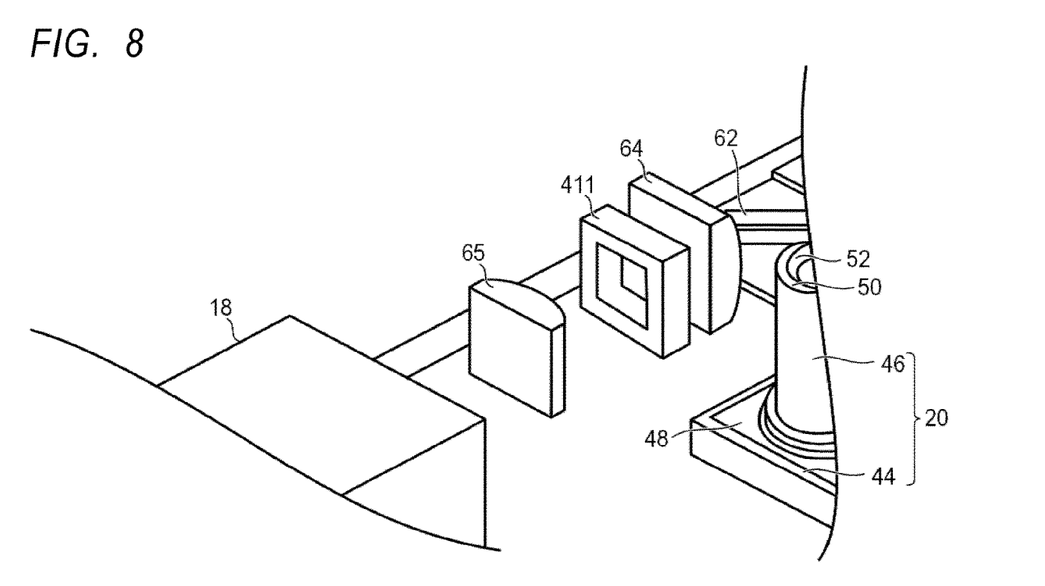
FIG. 8 is an enlarged partial perspective view illustrating the arrangement of an aperture in a semiconductor laser module according to a fourth embodiment of the present invention.

As illustrated in FIG. 8, in a semiconductor laser module according to the fourth embodiment, the aperture 411 is a member formed of a frame forming a rectangular hole portion as a space through which the laser light passes. The feature that the space in the aperture 411 through which the laser light passes has a rectangular shape is the same as the aperture 211 used in the second embodiment. Further, for example, the feature that the laser light in the slow axis direction can be guided to the condensing lens 64 at the same width regardless of the position in the fast axis direction when the aperture 411 is provided in front of the part where the laser light enters the condensing lens 64 is also the same as the second embodiment.

While different configurations of aperture have been described as examples in the first to fourth embodiments, the configuration of the aperture according to the present invention is not limited thereto and may be any configuration that has a space in the central part of the slow axis direction through which the laser light passes and a member that interposes the space and prevents passage of the laser light at the slow axis end part.

Fifth Embodiment

A semiconductor laser module according to a fifth embodiment of the present invention will be described with reference to FIG. 9 and FIG. 10. Note that the same components as those of the semiconductor laser module according to the first embodiment described above are labeled with the same references, and the description thereof will be omitted or simplified.

Figure 9:
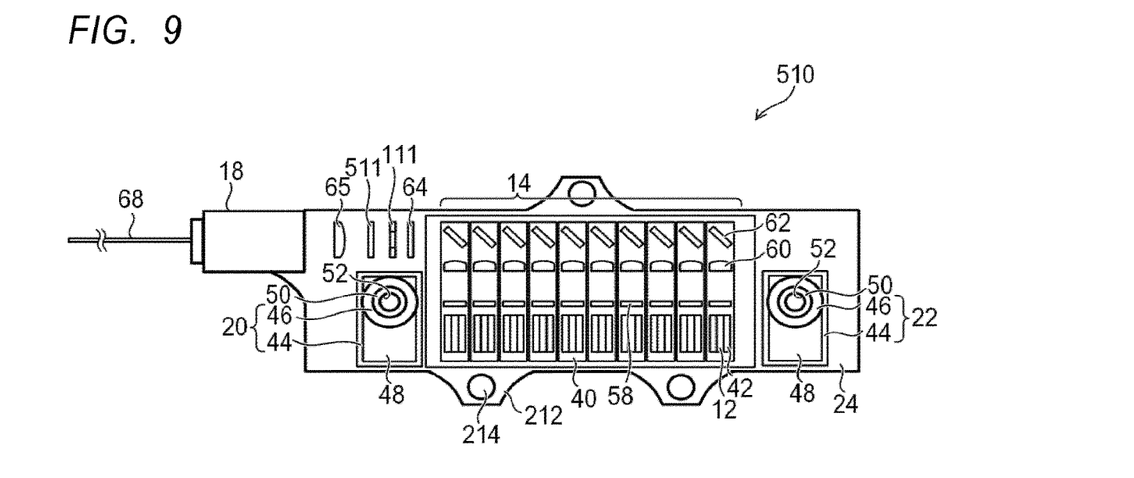
FIG. 9 is a top view illustrating a semiconductor laser module according to a fifth embodiment of the present invention.
Figure 10:
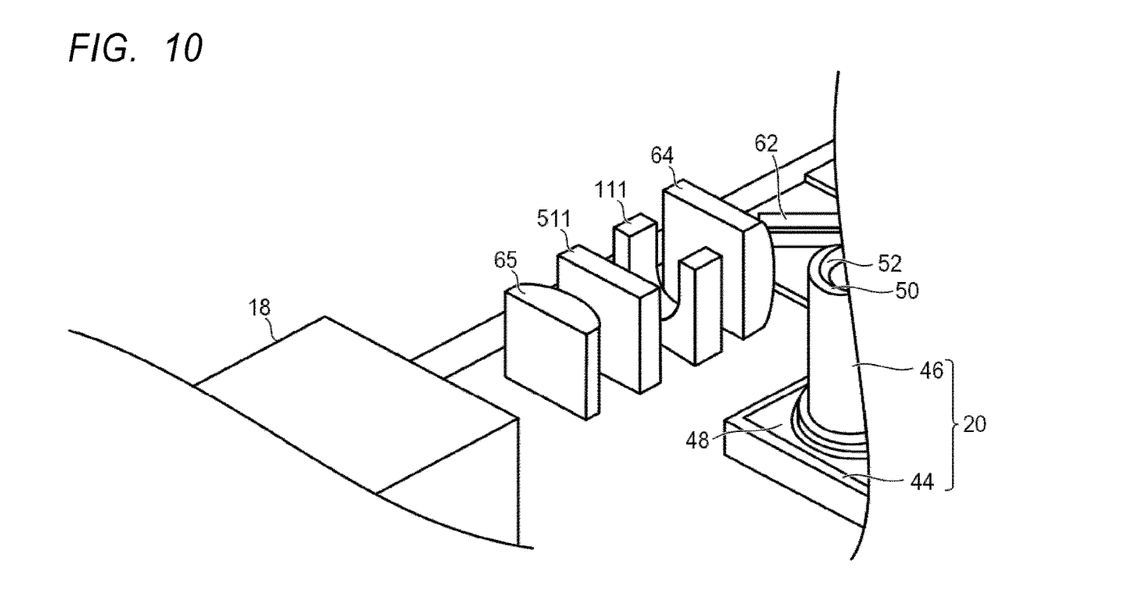
FIG. 10 is an enlarged partial perspective view illustrating the arrangement of a reflection mirror in the semiconductor laser module according to the fifth embodiment of the present invention.

As illustrated in FIG. 9 and FIG. 10, the configuration of a semiconductor laser module 510 according to the present embodiment is the same as the configuration of the semiconductor laser module 10 according to the first embodiment except that the reflection mirror 511 is provided between the aperture 111 and the condensing lens 65.

The reflection mirror 511 of the semiconductor laser module 510 according to the present embodiment reflects one part of the laser light with respect to the oscillation wavelength of the above semiconductor laser of the laser light collimated by a lens that collimates the laser light emitted from a semiconductor laser element.

The reflection mirror 511 can be provided on the optical path between the semiconductor laser element 12 and the output unit 18 and is preferably provided between the condensing lens 64 and the condensing lens 65. The material and the shape of the reflection mirror 511 may be the same as those of generally used reflection mirrors. Further, the reflectance of the reflection mirror 511 is preferably greater than or equal to 4% in terms of recoupling the light restricted by the aperture in the semiconductor laser. Although the reflection mirror 511 of the semiconductor laser module 510 according to the present embodiment is arranged such that the face irradiated with the laser light is arranged in the direction orthogonal to the optical axis of the laser light, the reflection mirror 511 may be arranged in the other direction with respect to the optical axis of the laser light as long as a laser irradiated face of the optical filter is irradiated with the laser light.

Sixth Embodiment

The semiconductor laser module according to a sixth embodiment of the present invention will be described with reference to FIG. 11. Note that the same components as those of the semiconductor laser module according to the first embodiment described above are labeled with the same references, and the description thereof will be omitted or simplified.

Figure 11:
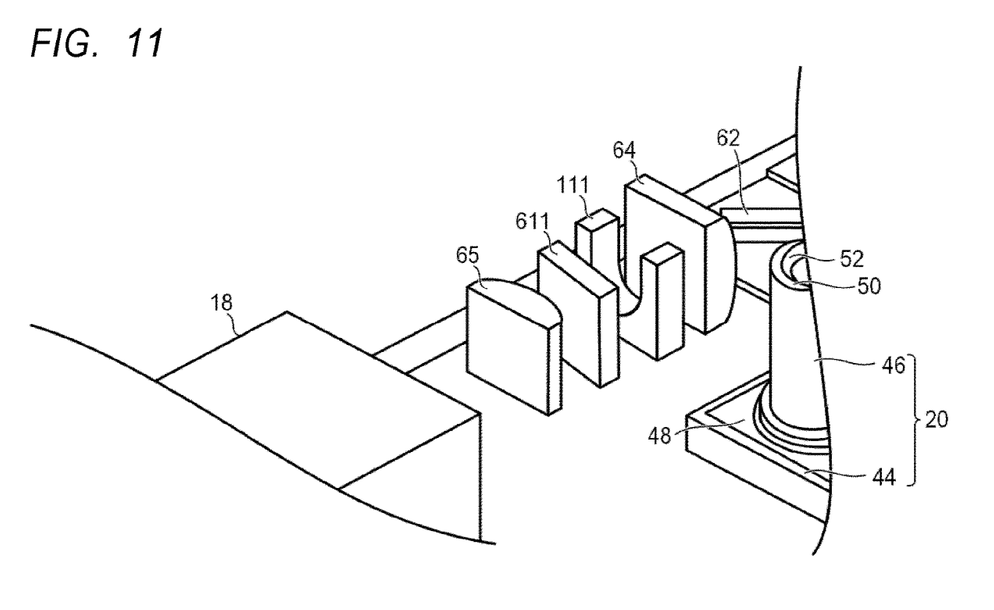
FIG. 11 is an enlarged partial perspective view illustrating the arrangement of an optical filter in the semiconductor laser module according to a sixth embodiment of the present invention.

As illustrated in FIG. 11, the configuration of the semiconductor laser module according to the present embodiment is a configuration in which the reflection mirror 511 of the semiconductor laser module 510 according to the fifth embodiment is replaced with the optical filter 611, and the other components are the same as those of the configuration of the semiconductor laser module 510.

The optical filter 611 is arranged between the two condensing lenses 64 and 65 and is preferably inclined at 2 degrees or greater, for example. The optical filter 611 reflects light, for example, light having a wavelength of 1060 nm to 1080 nm that propagates through the optical fiber 68 and is emitted from the outside. At this time, since the optical filter 611 is inclined, this can prevent the reflection light from recoupling to the optical fiber 68 or causing burnout of an adhesive agent or the like that fixes the optical fiber 68.

Further, since the optical filter 611 is arranged between two condensing lenses, when the light that propagates and is emitted from the outside through the optical fiber 68 is reflected at the optical filter 611, this can prevent the light from being recondensed near the optical fiber 68. Accordingly, it is possible to suppress breakage of the optical fiber fixing portion or the like by irradiation light from the outside. When the optical filter 611 is arranged on the optical fiber 68 side from the two condensing lenses, while re-condensing of the light can be suppressed, the optical fiber fixing portion is also irradiated with the light, which is not preferable. Further, when the optical filter 611 is arranged outside the two condensing lenses, the light is re-condensed at one point, and there is a risk of burnout of a component such as the optical fiber fixing portion. Therefore, the case where a filter is inclined and arranged between two condensing lenses can exhibit the maximum advantage.

Note that, as a modified example of the fifth embodiment and the sixth embodiment, both the reflection mirror 511 and the optical filter 611 may be provided. In such a case, it is preferable that the reflection mirror 511 be arranged on the side near the aperture 111, and the optical filter 611 be arranged on the side near the condensing lens 65. Further, a single component including functions of the reflection mirror 511 and the optical filter 611 may be employed.

Seventh Embodiment

A semiconductor laser module according to a seventh embodiment of the present invention will be described with reference to FIG. 11. Note that the same components as those of the semiconductor laser module according to the first embodiment described above are labeled with the same references, and the description thereof will be omitted or simplified.

Figure 12:
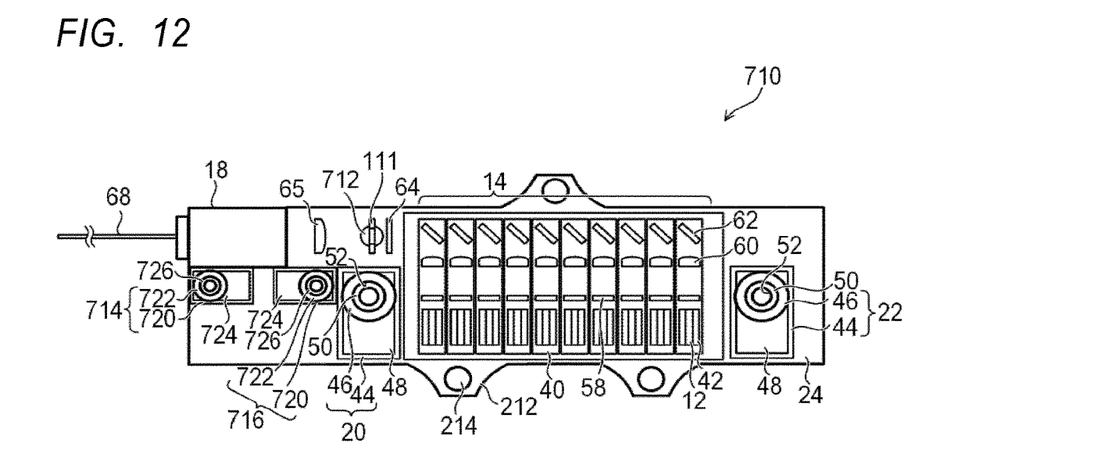
FIG. 12 is a top view illustrating a semiconductor laser module according to a seventh embodiment of the present invention.

The basic configuration of the semiconductor laser module 710 according to the present embodiment is the same as the configuration of the semiconductor laser module 10 according to the first embodiment. In addition to the configuration of the semiconductor laser module 10 according to the first embodiment, the semiconductor laser module according to the present embodiment further has an electronic component that is different from the semiconductor laser element 12 and a terminal portion corresponding thereto.

FIG. 12 is a top view illustrating the semiconductor laser module according to the present embodiment.

As illustrated in FIG. 12, in addition to the configuration of the semiconductor laser module 10 according to the first embodiment, a semiconductor laser module 710 according to the present embodiment has an electronic component 712 and terminal portions 714 and 716 corresponding thereto.

The electronic component 712 is provided on the upper face of the bottom plate portion 24. Further, the terminal portions 714 and 716 are also provided on the upper face of the bottom plate portion 24.

The electronic component 712 is different from the semiconductor laser element 12 and is a driving component that causes the direction of the aperture 111 relative to the optical axis of the laser light to be adjustable. The electronic component 712 is installed under the aperture 111. The electronic component 712 is a rotation stage, for example, and can adjust the direction of the aperture 111 relative to the optical axis of the laser light by external control. The bottom plate portion 24 is expanded compared to the first embodiment in order to provide the electronic component 712 and the terminal portions 714 and 716.

The terminal portions 714 and 716 corresponding to the electronic component 712 are installed on a region near the electronic component 712 of the bottom plate portion 24, respectively. The terminal portions 714 and 716 are electrically connected to the external circuit unit in accordance with the electronic component 712 to implement the function of the electronic component 712, respectively.

The terminal portions 714 and 716 each have a component connection portion 720 and an external connection portion 722 electrically connected to a component connection portion 720. The terminal portions 714 and 716 each are of a connection form using a screw in external electrical connection. The component connection portion 720 and the external connection portion 722 of the terminal portions 714 and 716 have the same structure as the element connection portion 44 and the external connection portion 46 of the terminal portions 20 and 22, respectively.

The component connection portion 720 of each of the terminal portions 714 and 716 is provided on the top face of the bottom plate portion 24. In such a way, the component connection portion 720 that is a part of each of the terminal portions 714 and 716 is provided to the bottom plate portion 24. The component connection portion 720 of each of the terminal portions 714 and 716 has a sheet-like conductor 724. The sheet-like conductor 724 is provided parallel to the bottom plate portion 24. The sheet-like conductor 724 is electrically connected to the electrode of the electronic component 712 via a wire by wire bonding, for example.

More specifically, the sheet-like conductor 724 of the component connection portion 720 in the terminal portion 714 is electrically connected to one electrode of the electronic component 712 via a wire by wire bonding. Further, the sheet-like conductor 724 of the component connection portion 720 in the terminal portion 716 is electrically connected to the other electrode of the electronic component 712 via a wire by wire bonding. Note that the method for electrically connecting the sheet-like conductor 724 of the component connection portion 720 and the electrode of the electronic component 712 is not limited to the method using wire bonding, and various methods can be used.

The external connection portion 722 of each of the terminal portions 714 and 716 is provided on the component connection portion 720. The external connection portion 722 of each of the terminal portions 714 and 716 has a columnar conductor 726 formed in a columnar shape perpendicular to the bottom plate portion 24, for example. In each of the terminal portions 714 and 716, the columnar conductor 726 is electrically connected to the sheet-like conductor 724. Each of the columnar conductors 726 has an internal thread hole 728 opened upward at the top end. Each internal thread hole 728 is used for external electrical connection, as described later. In such a way, the external connection portion 722 of each of the terminal portions 714 and 716 is provided facing upward with respect to the bottom plate portion 24 in the same manner as the external connection portions 46 of the terminal portions 20 and 22. That is, the external connection portion 722 that is a part of each of the terminal portions 714 and 716 is provided so as to extend in the opposite direction to the installation face on the opposite side to the installation face to which the bottom plate portion 24 is installed and fixed.

The external connection portion 722 of each of the terminal portions 714 and 716 can be externally electrically connected by using a screw or a thread portion that are screwed to the internal thread hole 728. For example, a bus bar that is a conductor bar is in contact with the columnar conductor 726 and is fixed to the external connection portion 722 by a screw screwed to the internal thread hole 728, and the external connection portion 722 can be externally electrically connected via the fixed bus bar. Further, by using an external terminal having an external thread portion screwed to the internal thread hole 728, the external thread portion of the external terminal is screwed and fixed to the internal thread hole 728, and the external connection portion 722 can be externally electrically connected via the fixed external terminal. Further, for example, an external terminal that is a crimp-style terminal having a round shape or a tip-opened shape is contacted with the columnar conductor 726 and is fixed to the external connection portion 722 by using an external thread screwed to the internal thread hole 728, and the external connection portion 722 can be externally electrically connected via the fixed external terminal.

As described in the present embodiment, by providing the electronic component 712 that is a driving component used for causing the direction of the aperture 111 relative to the optical axis of laser light to be adjustable, it is possible to suitably adjust the width of a space of the aperture 111 through which laser light passes. That is, in accordance with a usage condition of the semiconductor laser module 710, NAh of laser light emitted from the semiconductor laser element 12 can be restricted to a desired value as appropriate.

Note that, as a modified example of the seventh embodiment, the reflection mirror 511, the optical filter 611, or both thereof illustrated in the fifth embodiment and the sixth embodiment may be provided. When both the reflection mirror 511 and the optical filter 611 are provided, it is preferable that the reflection mirror 511 be arranged on the side near the aperture 111, and the optical filter 611 be arranged on the side near the condensing lens 65. Further, a single component including functions of the reflection mirror 511 and the optical filter 611 may be employed.

What is claimed is:

1. A semiconductor laser module comprising:
   a mounted-base member having a mounted-base face;
   a plurality of semiconductor laser elements installed on the mounted-base face of the mounted-base member;
   a plurality of lenses that collimate laser light emitted from the plurality of semiconductor laser elements;
   a condensing lens that condenses the laser light;
   an optical fiber to which the condensed laser light is optically coupled; and
   an aperture provided between the condensing lens that condenses the laser light and the plurality of lenses that collimate the laser light emitted from the plurality of semiconductor laser elements, and configured to restrict light in a slow axis direction of the laser light, wherein the aperture comprises a member defining a space through which the laser light passes, the space having a U-shape or a rectangular shape in a direction perpendicular to a traveling direction of the laser light such that the aperture causes the laser light guided to the condensing lens to have a constant width in the slow axis direction regardless of a position of the laser light in a fast axis direction.

2. The semiconductor laser module according to claim 1, wherein the condensing lens is formed of a single condensing lens or a plurality of condensing lenses.

3. The semiconductor laser module according to claim 1, wherein the aperture is formed integrally with or independently of the condensing lens.

4. The semiconductor laser module according to claim 1 further comprising a reflection mirror that reflects, out of laser light collimated by the lens that collimates laser light emitted from the semiconductor laser element, laser light having a wavelength that is a part of an oscillation wavelength of the semiconductor laser element.

5. The semiconductor laser module according to claim 4, wherein a reflectance of the reflection mirror is greater than or equal to 4%.

6. The semiconductor laser module according to claim 1 further comprising, between the aperture and the condensing lens, an optical filter that reflects light having a different wavelength from an oscillation wavelength of the semiconductor laser element.

7. The semiconductor laser module according to claim 6, wherein the optical filter is arranged at an angle with respect to an optical axis of laser light collimated by the lens that collimates laser light emitted from the semiconductor laser element.

8. The semiconductor laser module according to claim 6, wherein the optical filter reflects a longer wavelength than the oscillation wavelength of the semiconductor laser element.

9. The semiconductor laser module according to claim 1, wherein the aperture has a mechanism that causes a direction relative to an optical axis of the laser light to be adjustable after assembly of the semiconductor laser module.

10. A light source device comprising:
    the semiconductor laser module according to claim 1; and
    a base member having an installation face to which the semiconductor laser module is installed.

11. An optical fiber laser comprising:
    the light source device according to claim 10;
    an optical fiber for amplification; and
    an incident portion that causes laser light output from the semiconductor laser module of the light source device to enter the optical fiber for amplification.

12. The semiconductor laser module according to claim 1, wherein the aperture is configured to limit an end portion in the slow axis direction of the laser light collimated by the plurality of lenses that collimate before being guided to the lens that condenses the laser light such that for a number of apertures in the slow axis direction of the laser light entering the lens that condenses the laser light has a value equal to or less than a value limited by a width of the space defined by the member of the aperture.

* * * * *